(12) United States Patent
Talaga, Jr.

(10) Patent No.: US 8,368,435 B2
(45) Date of Patent: Feb. 5, 2013

(54) METHOD AND APPARATUS FOR JITTER REDUCTION

(75) Inventor: Ron F. Talaga, Jr., West Linn, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 81 days.

(21) Appl. No.: 12/856,395

(22) Filed: Aug. 13, 2010

(65) Prior Publication Data

US 2012/0038400 A1    Feb. 16, 2012

(51) Int. Cl.
     *H03L 7/06*    (2006.01)
(52) U.S. Cl. ............................ 327/156; 327/147
(58) Field of Classification Search .............. 327/147, 327/156
See application file for complete search history.

(56) References Cited

U.S. PATENT DOCUMENTS

| | | | | | |
|---|---|---|---|---|---|
| 4,849,998 | A | * | 7/1989 | Poklemba | 375/377 |
| 5,194,828 | A | * | 3/1993 | Kato et al. | 331/1 A |
| 6,111,712 | A | * | 8/2000 | Vishakhadatta et al. | 360/51 |
| 7,978,012 | B2 | * | 7/2011 | Wood | 331/2 |
| 2005/0186918 | A1 | * | 8/2005 | Ramet et al. | 455/76 |
| 2006/0001494 | A1 | * | 1/2006 | Garlepp et al. | 331/2 |
| 2008/0111597 | A1 | * | 5/2008 | Cranford et al. | 327/156 |
| 2008/0265998 | A1 | * | 10/2008 | Wood | 331/2 |
| 2008/0290953 | A1 | * | 11/2008 | Sandner et al. | 331/2 |
| 2009/0141774 | A1 | * | 6/2009 | Araki et al. | 375/130 |
| 2009/0244375 | A1 | * | 10/2009 | Moehlmann et al. | 348/512 |
| 2011/0032013 | A1 | * | 2/2011 | Nelson et al. | 327/156 |
| 2012/0038400 | A1 | * | 2/2012 | Talaga, Jr. | 327/156 |

OTHER PUBLICATIONS

Analog & Power, "An Introduction to clock distribution circuits", Alexander Pakosta, Texas Instruments, 2 pages, date unknown.
Texas Instruments, Application Report, "Using the CDCL6010 as a Frequency Synthesizer and Jitter Cleaner", Madhu Balasubramanian, SLLA259—Mar. 2007, Copyright © 2007, Texas Instruments Incorporated, 15 pages.
CDC7005, "3.3-V High Performance Clock Synthesizer and Jitter Cleaner", SCAS685J—Dec. 2002—Revised Jul. 2008, Copyright © 2008, Texas Instruments Incorporated, 33 pgs.

* cited by examiner

*Primary Examiner* — Adam Houston
(74) *Attorney, Agent, or Firm* — Weide & Miller, Ltd.

(57) ABSTRACT

A low bandwidth phase lock loop (PLL) arranged in a dual-loop configuration is disclosed. The first loop is a standard loop configuration using a crystal oscillator as a reference clock. The loop parameters for this first PLL can be optimized to work over a wide range of output frequencies, and with a minimum amount of jitter. The first loop outputs a reference signal, which is a VCO output. The second loop comprises a bang-bang detector configured to drive a digital loop filter, which then drives a phase interpolator. The phase interpolator manipulates the output phase. Since phase and frequency are related, where frequency is the derivative of phase, small frequency offsets can be made using a phase control signal, generated within the second loop based on the relation between the reference signal and the clock input signal. The second loop sets the jitter transfer bandwidth of the system.

15 Claims, 4 Drawing Sheets

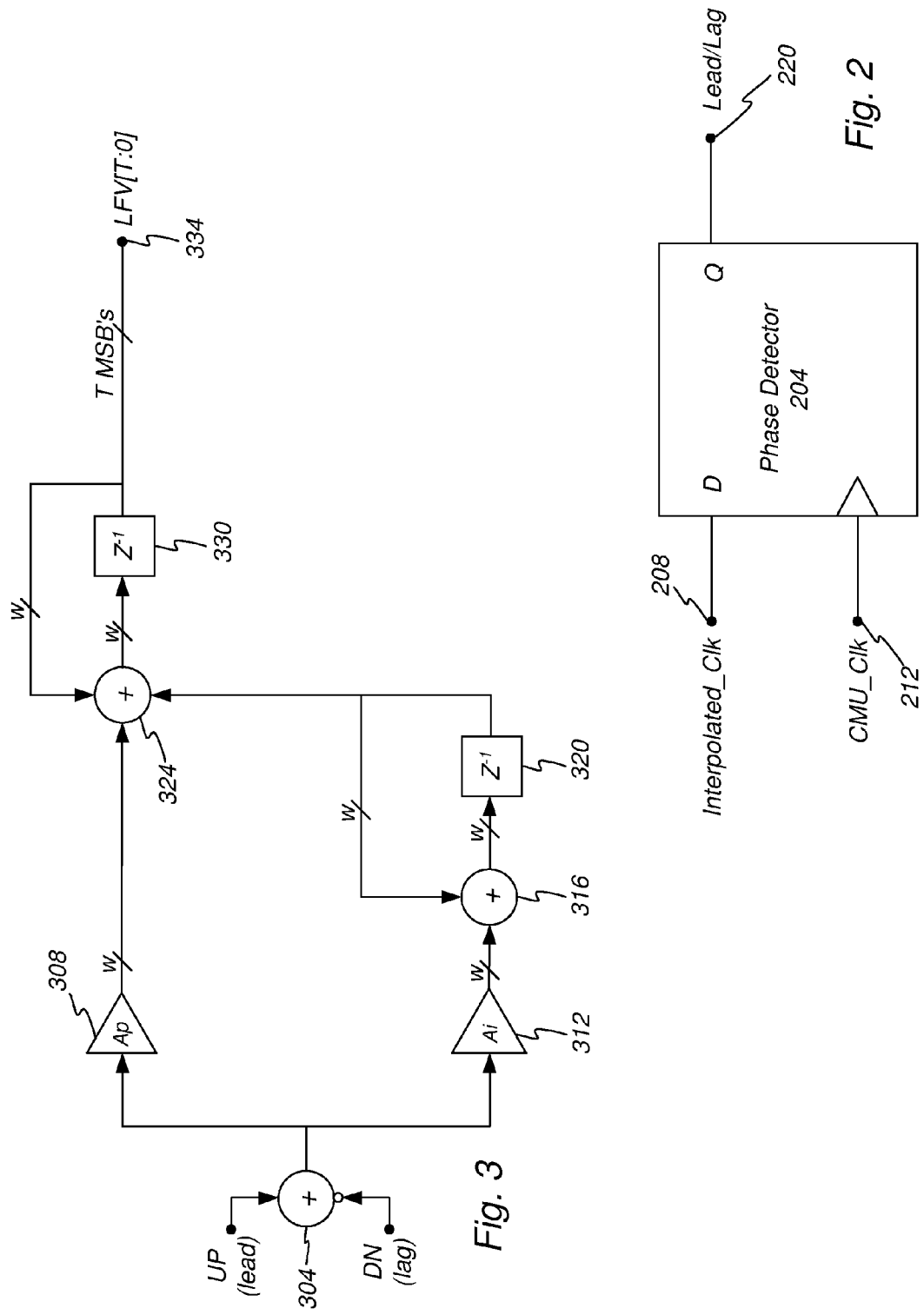

METHOD AND APPARATUS FOR JITTER REDUCTION

1. FIELD OF THE INVENTION

The invention relates to reducing jitter and in particular to a jitter reducing phase lock loop circuit.

2. RELATED ART

Numerous types of modern professional and consumer electronic devices and most all communication system utilized one or more clock signals to syncronize operation between its various systems. Often there is a central system clock which synchronizes operation between the different subsystems with a single device or between remote communication stations. As is understood, modern electronic devices, such as cameras, video recorders, telephones, computers, TV, and other consumer electronics have numerous subsystems which must exchange data and maintain synchronization. The central clock is often distributed to numerous different sub-systems over a bus or clock signal path. Likewise, synchronization between communication devices is likewise essential to operation.

Not only is clock synchronization necessary, but the performance demands of modern devices have caused clock speeds to increase. This in turn leaves less margin for error before glitches, bit errors, or other unwanted behavior may occur. Systems that in the past that had clocks in the kilohertz or low megahertz range are now operating in the high megahertz or even gigahertz range. As such, the need to maintain clock synchronization or provide a uniform clock signal to all subsystems is of great importance.

One unwanted characteristic of clock distribution and data communication is signal jitter. Jitter is defined as an unwanted phase displacement of the actual clock signal in relation to the original or ideal clock signal. Thus, after a clock signal leaves the clock signal source, it is affect by channel distortion, noise and other interference. This results in changes in its phase, also known as jitter or phase distortion.

Jitter in a clock signal or any signal affects the ability of the system to properly synchronize that signal with other signals and systems. For example, an analog to digital converter when presented with a jitter affected clock signal will make signal output decisions when digitizing the analog input signal at an improper time which in turn will yield an incorrect decision. The same situation arises in slicers or quantizers in communication devices. This is particularly true when serial data must go through several locations or hops on its path to its destination. At each hop, jitter will be generated and then transmitted on to the next hop. Later devices in the chain will add their generated jitter to the jitter generated from previous hops. To keep the jitter from growing too large, it is desirable to be able to limit the amount of jitter transfer, and set a baseline jitter.

A similar situation arises in data serialization. The clock for the low-frequency data is multiplied in frequency, and any jitter on this clock will show up in the transmitted data. Since this jitter is constant in time, the amount in UI (unit of jitter) is multiplied by the serialization factor (for instance, 10 mUI of low speed jitter with a 1:10 serializer produces 100 mUI of output jitter). The low-frequency clock often comes from an FPGA (field programmable gate array) or other device, and is thus it is difficult to extend this clock to other systems with sufficiently low jitter. It would be desirable to have a CMU (clock multiplier unit) that could tolerate large amounts of input jitter without producing much output jitter.

Several solutions have been proposed to process a signal to remove jitter. One such proposed solution is a special 1:1 PLL (phase lock loop), using a VCXO (voltage controlled crystal oscillator). This solution uses mostly external components. A second solution is to use a low phase noise VCO (voltage controlled oscillator) in a CMU. This solution can be integrated onto an IC. While these solutions provide some benefit to address the drawbacks in the prior art associated with jitter, these solutions suffer from several drawbacks. For example, a VCXO is an expensive part which may cost on the order of ten to thirty times more than the solution disclosed here. The low phase noise VCO in a CMU solution suffers from the drawback of having a very narrow tuning range.

Therefore, a need continues to exist in the art for a jitter reducing or cleaning solution for electronic circuits.

SUMMARY

To overcome the drawbacks of the prior art and provide additional benefits, a method for reducing jitter in a received clock input signal is disclosed. This method comprises receiving a high frequency clock signal based on a reference signal such that the reference signal is at a first frequency and a first phase, while the high frequency clock signal is also at the first frequency and the first phase. The method also comprises receiving a clock input signal at a second frequency and at a second phase, wherein the second frequency and the second phase is different than the first frequency and the first phase. Then, receiving the high frequency clock signal at a phase interpolator and processing the high frequency clock signal with the phase interpolator based on input from a loop filter to generate a high frequency clock output which has less jitter than the high frequency clock signal. Also occurring as part of this method is receiving the clock input signal and a divided version of the high frequency clock output at a phase detector and then processing the clock input signal and the divided version of the high frequency clock output with the phase detector to generate one or more loop filter input signals to a loop filter. This method also receives the one or more loop filter input signals at a loop filter and processes the one or more loop filter input signals with the a loop filter to generate the input to the phase interpolator.

In one embodiment, a first phase lock loop generates the high frequency clock signal. It is contemplated that the processing the high frequency clock signal and the clock input signal comprises changing the phase of the high frequency clock signal to match the phase of the clock input signal. In one embodiment, the high frequency clock signal provided to the phase interpolator is generated by an integer phase lock loop fractional-N phase lock loop, delay locked loop, or a high-Q oscillator. The method may further comprising comparing the clock input signal and a version of the phase interpolator output to create lead/lag signal which is processed to calculate the input to the phase interpolator from the loop filter. The input to the phase interpolator from the loop filter may comprise a phase control signal.

Also disclosed is a system for reproducing a clock input signal to reduce jitter from the clock input signal where the clock input signal is at a first frequency. The system comprises a first loop comprising a phase detector configured to compare a reference signal to a first divider output to create at least one first lead/lag signal representing the phase relation between the reference signal to the first divider output. This system also includes a loop filter configured to processes the lead/lag signal to create a control voltage and a voltage controlled oscillator configured to generate a VCO output signal responsive to the control voltage. A divider changes the VCO output signal to create the first divider output.

Also part of this system is a second loop and the second loop comprises a loop filter configured to process at least one second lead/lag signal to generate a phase control signal. A phase interpolator is present to receive the phase control signal and adjust the phase of the VCO output signal from the voltage controlled oscillator based on the phase control signal to create a phase interpolator output matching the clock input signal but with less jitter than the clock input signal. Also part of this system is a divider configured to change the frequency of the phase interpolator output to create a second divider output and a phase detector configured to compare the clock input signal to the second divider output to create the at least one second lead/lag signal.

In one embodiment, the system further comprises a signal generator configured to generate the reference signal. The signal generator may comprise a crystal oscillator. The second loop may be a digital loop. It is contemplated that the phase control signal may comprise a digital signal representing a phase shift to be applied to the VCO output signal. In one embodiment, the VCO output signal has a frequency matching a frequency of the clock input signal and phase interpolator shifts a phase of the VCO output signal match a phase of the clock input signal according to the phase control signal.

Also disclosed herein is a system for reproducing a clock signal to create a reproduced clock signal while minimizing jitter. This system comprises a phase interpolator configured to receive and process a high frequency clock signal and a phase adjustment signal to create a reduced jitter high frequency clock output. A phase detector is part of this system and configured to receive and compare a low frequency clock signal and a processed version of the phase interpolator output and then generate one or more lead/lag signal responsive to the comparison. A loop filter is configured to receive one or more lead/lag signals and generate the phase adjustment signal such that the phase adjustment signal changes the phase of the high frequency clock signal to match the clock signal.

It is contemplated that this system may further comprise a divider configured to receive the phase interpolator output and generate a frequency divided output. In one embodiment the system further comprising a phase lock loop including a voltage controlled oscillator. The phase lock loop may include a voltage controlled oscillator that generates the high frequency clock signal. The phase lock loop may further comprise a crystal. The phase detector may comprise one or more flip flops. The loop filter may comprise two or more integrators. The phase interpolator may comprise a mixer or phase shifter.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 2 is an example phase detector used in conjunction with a digital loop filter.

FIG. 3 is an exemplary loop filter implementation, such as for example the loop filter for the second loop.

DETAILED DESCRIPTION

To overcome the drawbacks of the prior art and provide additional benefits, disclosed herein is a low bandwidth phase-locked loop (PLL) arranged in a dual-loop approach. In one embodiment, the first loop is a standard CMU (clock multiplier unit) using a crystal oscillator as a reference clock. The loop parameters for this first PLL can be optimized to work over a wide range of output frequencies, and with a minimum amount of jitter.

As part of the dual loop arrangement, a second loop is provided. In one embodiment the second loop comprises a bang-bang detector to drive a digital loop filter, which then drives a phase interpolator 150. The phase interpolator 150 may also comprise a mixer, or phase shifter. The phase interpolator 150 manipulates the output phase. Since phase and frequency are related (frequency is the derivative of phase), small frequency offsets (less than 5000 PPM) can be dealt with. It is this inner loop (second loop) which sets the jitter transfer bandwidth of the overall system.

Figure 1:
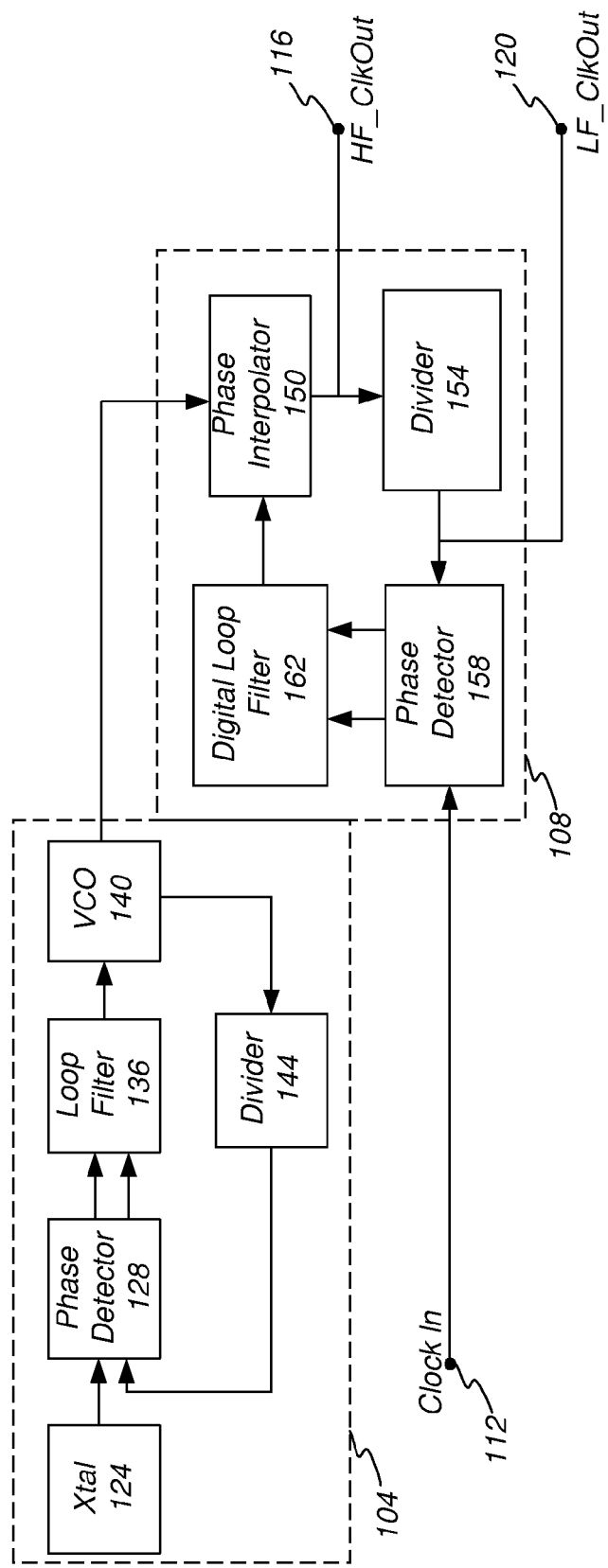
FIG. 1 is an example block diagram of an example embodiment of a dual stage phase lock loop.

Turning now to the figures, FIG. 1 illustrates an example block diagram of an example embodiment of a dual loop PLL. In this example embodiment, a first loop 104 interfaces with a second loop 108 as shown. Providing an input to the second loop is a clock signal on a clock input 112. The second loop provides a high frequency signal output 116 and a low frequency signal output 120. In another embodiment additional or fewer outputs may be provided.

In reference to the first loop 104, an oscillator crystal 124 is provided to generate a reference frequency. It is contemplated that the crystal is excited with a voltage or other energy source to generate the resulting reference voltage. In other embodiments elements other than a crystal 124 may be utilized to generate the reference frequency including, but not limited to less than 300 MHz or typically less than 150 MHz or including but not limited to several kHz.

The output of the crystal 124 is provided as an input to a phase detector 128. A second input to the phase detector 128 comprises a feedback signal from a divider 144. The phase detector 128 determines which of its two inputs is leading or lagging in phase and outputs, in this example embodiment, a corresponding up or down signal on the outputs 132. These outputs may represent lead/lag signal(s). In other embodiments, a single output may be utilized which is positive or negative, or a logic zero or logic one level. A digital signal may also be output.

A loop filter 136 receives the output(s) from the phase detector 128. The loop filter 136 processes the up and down (lead/lag) signals from the phase detector 128 to maintain loop dynamics or stability. This filter 136 determines how the loop responds to disturbances, such as changes in the reference frequency, changes of the feedback divider, or at startup. Aspects which may be controlled by the loop filter 136 are the range over which the loop can achieve lock (pull-in range or lock range), how fast the loop achieves lock (lock time or lock-up time) and damping. Another aspect of operation of the loop filter 136 is that it limits the amount of reference frequency energy (ripple) appearing at the phase detector output that is then applied to the VCO control input. The low pass characteristic of this loop filter 136 can be used to attenuate this unwanted signal components. The loop filter 136 may comprise any type PLL filter as is known in the art. This may comprise some form of proportional and integral (PI) filter, which may include a charge pump, and a capacitor in parallel with a resistor/capacitor filter. In other embodiments the loop filter 136 may comprise any components or arrangement.

The output of the loop filter connects to the VCO 140. The VCO 140 generates an output signal at a frequency determined by the voltage level of the loop filter 136. VCO 140 operation is understood in the art and as such is not discussed herein. The output of the VCO 140 feeds into a divider 144 and a phase interpolator 150 associated with the second loop 108. In the embodiment, the divider 144 divides its input by a value M, where M is any value as determined by design parameters. The divider 144 divides the VCO output back down to the frequency range of the crystal 124 such that the phase detector may accurately track the difference between the crystal output and the VCO output.

It is contemplated that the first loop may be replaced with any output, element or device that provides a high frequency clock to the second loop. This may comprise but is not limited to a integer PLL as described herein, or a fractional-N PLL, a delay locked loop, a high-Q oscillator or a modified clock generator. The first loop may be implemented in the analog or digital domain. By separating the generation and tracking loops and using phase shifting (phase interpolation) in the tracking loop, the benefits and advantages discussed herein are realized.

The phase interpolator 150 of the second loop 108 receives the output of the VCO 140 and an input from a digital loop filter 162. The loop filter 162 is described below in greater detail in connection with FIG. 3. The output of the phase interpolator 150 is presented as the high frequency signal on the high frequency output 116. The phase interpolator output also feeds into a divider 154, which as understood divides down the frequency of the phase interpolator output signal. In this embodiment the divider 154 divides by a value N, where N is any value as determined by design parameters. The output of the divider 154 comprises the low frequency output signal on the low frequency output 120 and the input to a phase detector 158.

The phase detector 158 compares the phase of the clock signal received on input 112 with the input from the divider 154. As described above, responsive to this comparison, the phase detector 158 outputs an up signal or down signal (lead/lag) or both, to a digital loop filter 162. In one embodiment, the inputs to the digital loop filter 162 comprise digital inputs. The digital loop filter 162 processes the one or more input signals from the phase detector 158 to create a phase control signal. The phase control signal is presented to the phase interpolator 150. In this embodiment the output of the digital loop filter 162 is a digital code and the value of the code represents saw tooth wave. The output of the digital loop filter 162 is presented to the phase interpolator 150. In other embodiments another type signal format may be output. The frequency of the saw tooth wave will be the frequency difference between the low frequency clock out and the clock in signals.

Upon receipt of these inputs, the phase interpolator 150 adjusts the phase of the VCO output signal based on the phase control signal from the digital loop filter 162. By adjusting the phase of the VCO output signal, the phase of the VCO output signal is made to match the clock input.

Figure 4:
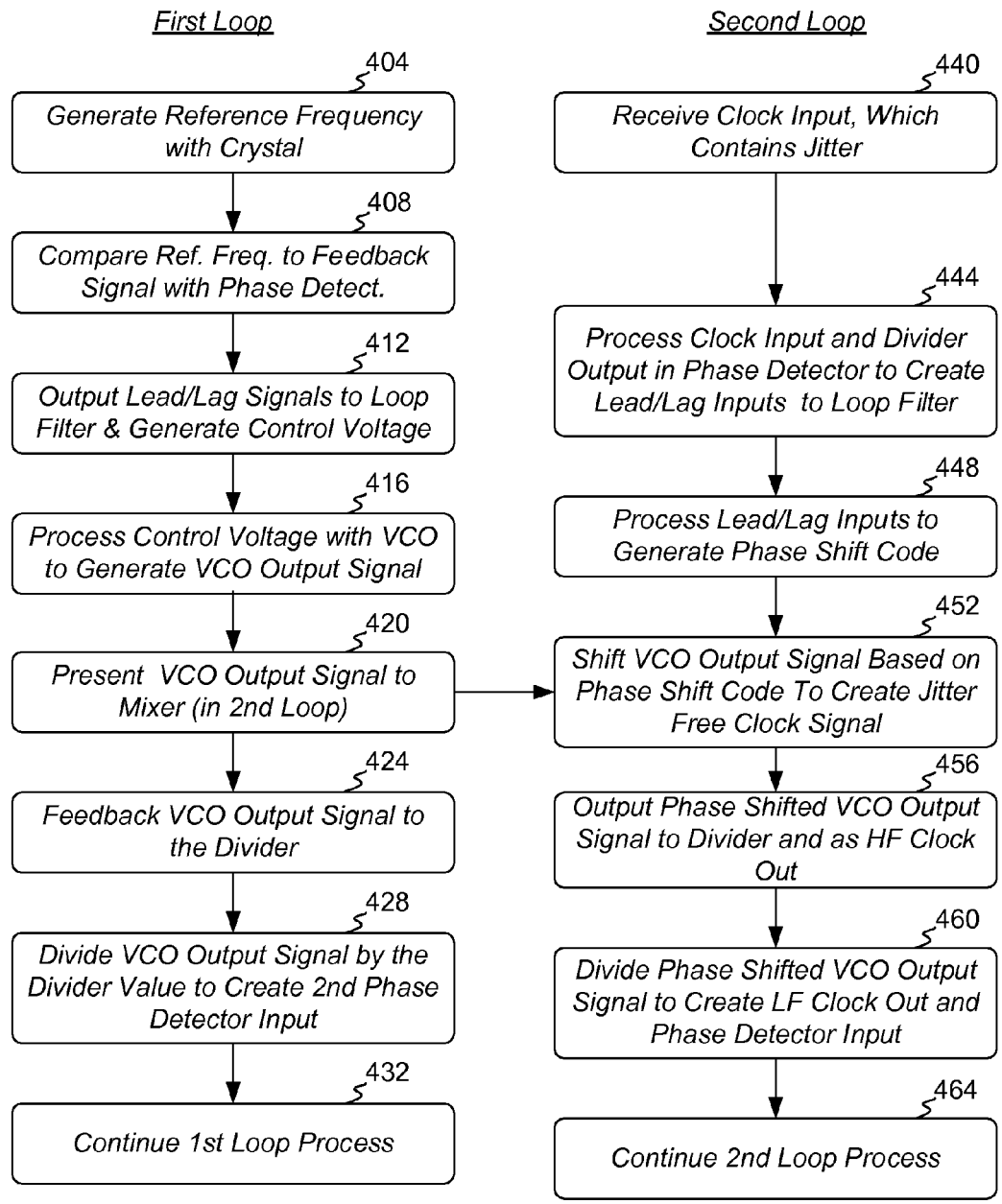
FIG. 4 is an operational flow diagram of an example method of operation of the example embodiment of FIG. 1.

In operation, the first loop 104 generates an output related to the reference frequency generated by the crystal. The output from the first loop 104 is presented to the phase interpolator 150 of the second loop 108. The second loop 108 adjusts the phase of the first loop output signal to reproduce the clock input signal in both phase and frequency. Operation continues in this matter to thereby track, reproduce, or clean signals received on the clock input 112. FIG. 4, and the associated text, provides additional discussion regarding operation of the system of FIG. 1.

FIG. 2 is an exemplary phase detector used in conjunction with a digital loop filter. This exemplary phase detector 204 may comprise the devices 128 or 158 of FIG. 1. This element may be realized in an analog or digital configuration. In this example embodiment, the phase detector 204 receives the phase interpolator input signal (after division) on input 208 and a CMU (clock multiplying unit) input signal on input 212. The phase interpolator input signal on input 208 connects to the D port of the detector 204 while the CMU input signal on input 212 is presented to the clock input port 212. An output 220 presents the lead lag signal from the Q port of the detector. On the single output of the phase detector a lead may be represented by a +1 while a lag may be represented by a 0. Other lead/lag representations are possible. In this embodiment the detector 204 comprises a D flip flop device which may also be referred to as a delay.

In this embodiment, the Q port output 220 always takes on the state of the D port input 208 at the moment of a positive edge of the clock input 212. (or negative edge if the clock input is negative edge triggered). Hence, the output takes the value of the D input or data input, and delays it by one clock count. It is contemplated the D flip-flop may comprise or be considered a basic memory cell, zero-order hold, or delay line. In this embodiment, the output of the phase detector 204 comprises a lead or lag signal which may be provided on a single or dual outputs. In one alternative embodiment a second digital flip flop (DFF) is presented with the clock and D inputs swapped and the output being inverted. The output may feed into basic logic configured to combine the two DFF outputs to produce lead/lag signals. The benefit of this embodiment with two DFF's is that the phase detector would have less offset due to set up time.

In reference to the operation of the device of FIG. 2, if both the interpolated_Clk input and CMU input are at the same phase but the CMU input signal rises before (leads) the interpolated_Clk input signal then the Q output is zero. Conversely, if the CMU input rises after (lags) the interpolated-_Clk input, then the Q output is a one value. The interpolated input may also be referred to as the feedback_clkThis functionality may be realized with different hardware or software combinations. If the two inputs are generally in phase, then the output will over time dither back and forth (or oscillate) and average out to zero.

FIG. 3 illustrates an example embodiment of a loop filter implementation. The embodiment of FIG. 3 may represent the digital loop filter 162 shown in FIG. 1, which received input from the phase detector 158. In this embodiment, a summing junction 304 receives an up signal input and a down signal input as shown. In this embodiment, the up signal represents a leading signal and a down signal represents a lagging signal. In one embodiment the lead input comprises a 1 value while the lag input comprises a −1 value. The inputs to the summing junction 304 represent the two inputs to either of the phase detectors 128, 158 as shown in FIG. 1. In one embodiment, the summing junction 304 sums the lead/lag inputs.

The output of the summing junction 304 connects to a proportional scaling unit 308 and an integral scaling unit 312. The scaling units 308, 312 comprise devices capable of increasing or decreasing the output of the summing junction 304. The proportional scaling unit 308 has a scaling factor defined by the value Ap and the integral scaling unit 312 has a scaling factor Ai. In one embodiment the scaling units 308, 312 comprise amplifiers or multipliers having gains of Ap and Ai as shown, which may be thought of as multiplication factors or filter gains. The gain may be positive or negative, or greater than or less than unity. The values Ap and Ai may comprise any value. The multiplication may comprise a shifting operation.

The output of the scaling unit 308 comprises a multibit signal, which in this embodiment is W bits wide, where W is any positive whole number. The output of the scaling unit 308 connects to a summing junction 324, which is discussed in more detail below. In general, the upper path, through element 308, acts as an up/down counter which counts by the scaling value Ap every cycle. This circuit may be realized in the digital or analog domain. In one embodiment the up/down counter includes the integrator formed by elements 324, 330.

The output of the scaling unit 312 comprises a W bit wide path which connects to a summing junction 316. The output of the summing junction 316 connects to a delay 320, which may comprises a plurality of flip flops or registers. The delay 320 delays the input by one or more clock cycles, which is understood by one of ordinary skill in the art. The output of the delay 320 is provided as a feedback signal to the summing junction 316 and as an input to the summing junction 324. The output of the summing junction 316 thus comprises the input from the scaling unit 312 and the feedback from the delay 320. As such, the loop of elements 316, 320 act as an accumulator, the value of which is input to the summing junction 324.

In operation, the lower path through element 316 provides a constant value offset, which represents a frequency offset. As discussed above, the summing junction 316 acts as an accumulator by nature of the delay and feedback loop which generates an offset value. The resulting signal output from the junction 316 is a saw or ramp function which would increment the output 334 regardless of the inputs Up/Down to device 304. This offset accounts for differences between the oscillator output frequency and the input clock frequency. This difference may be small, such as on the order of 20 ppm (parts per million), but should be corrected with an offset.

This allows the system shown in FIGS. 1-3 to produce a response to control frequency and phase. In summary, the top path in FIG. 3 controls phase and reduces jitter while the bottom path in FIG. 3 provides an offset which corrects for the frequency difference between the crystal and the input clock.

The summing junction 324 also receives the output of the scaling unit 308 and a feedback signal created by the delayed output of the summing junction. The delay 330 creates the delayed feedback signal such that elements 324, 330 act as an accumulator. The output of the delay is also presented as an output. In one embodiment a number of most significant bits are presented on an output 334. The number of most significant bits may comprise T where T comprises any whole number. As shown in FIG. 1, the output 334 may connect to a phase interpolator or VCO.

It is also contemplated that in the embodiment of FIG. 3, T−1 MSB's may be used and the T MSB is intentionally dithered to maintain an average value defined by the next K MSB's, including bit T−1. This alternative allows for noise shaping to occur. For example, the jitter in a certain bandwidth could be minimized by shifting much of it to a much higher frequency.

In operation, the lead and lag signals are presented to the summing junction 304, which over time outputs a +1 or −1 depending on the inputs values. The resulting output is presented to the two paths. In this embodiment the upper path, having the proportional scaling unit 308 comprises a phase control path while the lower path, having the integral scaling unit 312 comprises a frequency control path. The scaling units 308, 312 modify the signal based on the scaling factors Ap and Ai. The feedback loop comprised of elements 316, 320, which may be thought of as an accumulator, adjusts the difference between the inputs and provides an optional constant frequency offset. In one embodiment, the summing junction 316 or the delay 320 may be pre-loaded with a value prior to start up.

The output of the loop 316, 320, which comprises a frequency offset, feeds into the summing junction 324 to thereby provide the offset to the signal on the upper path, which acts as an up/down counter to count by a scaling factor Ap every cycle. A +1 value from the junction 304 results in an Ap value input to the summing to junction 324. Likewise, a −1 value from the junction 304 results in an −Ap value output by the scaling unit 308 to the junction 324.

The delay 330 acts as a flip flop or register that establishes a one cycle delay, which is feedback to the summing junction 324. Hence, the flip flop or register 330 value is added to itself, plus the correction or offset factor from the lower branch. In this embodiment one or more most significant bits of the resulting output are presented on the output 334. Taking only the most significant bits acts as an averaging function such that small or rapid changes (or oscillation) in the output value from the junction 324 are not represented in the output because small changes up or down in value only affect the least significant bits. As such, it requires multiple up or down inputs to change the value of the output. This may be considered as the loop bandwidth, such that it will track a change in the input over time, but not respond to oscillations or back and forth variations in the input. The scaling factors may be considered as controlling the response of the loop. Larger scaling factors increase the loop response time or bandwidth, while smaller scaling factors reduce the loop response time. Likewise, the bus size W and the number of most significant bits representing the output 334 also control the response time. In this embodiment the output signal of the loop filter shown in FIG. 3 comprises a digital code that feeds into the phase interpolator shown in FIG. 1.

FIG. 4 illustrates an operational flown diagram of an example method of jitter reduction using the system shown in FIG. 1. In other embodiments, other methods of operation may occur which do not depart from the claims that follow. In this exemplary embodiment, the discussion is separated into first loop steps and second loop steps, which are identified as shown in FIG. 4. In reference to FIG. 1, the first loop is the upper left-most loop while the second loop is the lower, right most loop. It is contemplated that the first loop and the second loop operate concurrently and are in communication.

Operation of the first loop is now discussed. At a step 404, the first loop generates the reference frequency with a crystal or other reference signal generator. Then, at a step 408 the phase detector compares the reference frequency to a feedback signal from the divider. This comparison occurs to determine which signal is leading or lagging in phase. Based on this comparison, at a step 412 the phase detector puts the lead/lag signal to the loop filter. The loop filter generates a control voltage, the value of which is based on whether the reference frequency from the crystal or the divider output was leading or lagging.

At a step 416 the VCO processes the control voltage from the loop filter to generate a VCO output voltage at the desired frequency. The VCO output signal is presented to the phase interpolator associated with the second loop at a step 420. The VCO output signal is at a frequency matching the crystal output and may be considered very low jitter signal, but it may not be ideally synchronized in phase with the clock input signal. From step 420, the operation advances to step 452 and step 424.

At step 424, the VCO output signal is fed back to the divider. At step 428, the divider associated with the first loop divides the VCO output signal by a divider value to create the second phase detector input, which was used in the comparison at step 408. After step 428, the operation advances to step 432 and the first loop continues in this manner.

In references to the second loop, at a step 440 the phase detector of the second loop receives the clock input. This clock input may be from any source within the circuit or other system, but it is assumed that it contains unwanted jitter. Through the processing within the second loop of the generally jitter free VCO output signal, the clock input signal may be reproduced with reduced or lower jitter.

At a step 444, the phase detector processes the clock input and the divider output to create the lead/lag inputs to the loop filter. The phase detector determines which input to the phase detector, either the clock input, or the output of the second divider, is leading in phase. The resulting output is presented to the digital loop filter. Thereafter, at step 448, the digital loop filter processes the lead/lag signals from the phase detector to generate a phase shift code. In this embodiment, the output of the digital loop filter comprises a digital phase shift code that represents the amount of phase difference between the VCO output signal and the clock input. This digital phase shift code is used by the phase interpolator to adjust the phase of the VCO output signal.

At a step 452 the phase interpolator shifts the VCO output signal based on the digital phase shift code to create a high frequency jitter free clock output and the input to the second loop divider. The output of the phase interpolator is generally free of jitter, and has the same phase as the clock input to signal presented to the phase detector, and the same frequency or a frequency that is a multiple of the input clock. At step 456, the phase interpolator outputs the phase shift code to the divider and as the high frequency clock output.

At step 460, the divider divides the phase shifted VCO output signal (i.e. phase interpolator output) to create the low frequency clock output signal and the input to the phase detector. The divider reduces the frequency of the phase interpolator output to create the low frequency signal. Thereafter, at step 464, the operation continues the second loop process.

Figure 5:
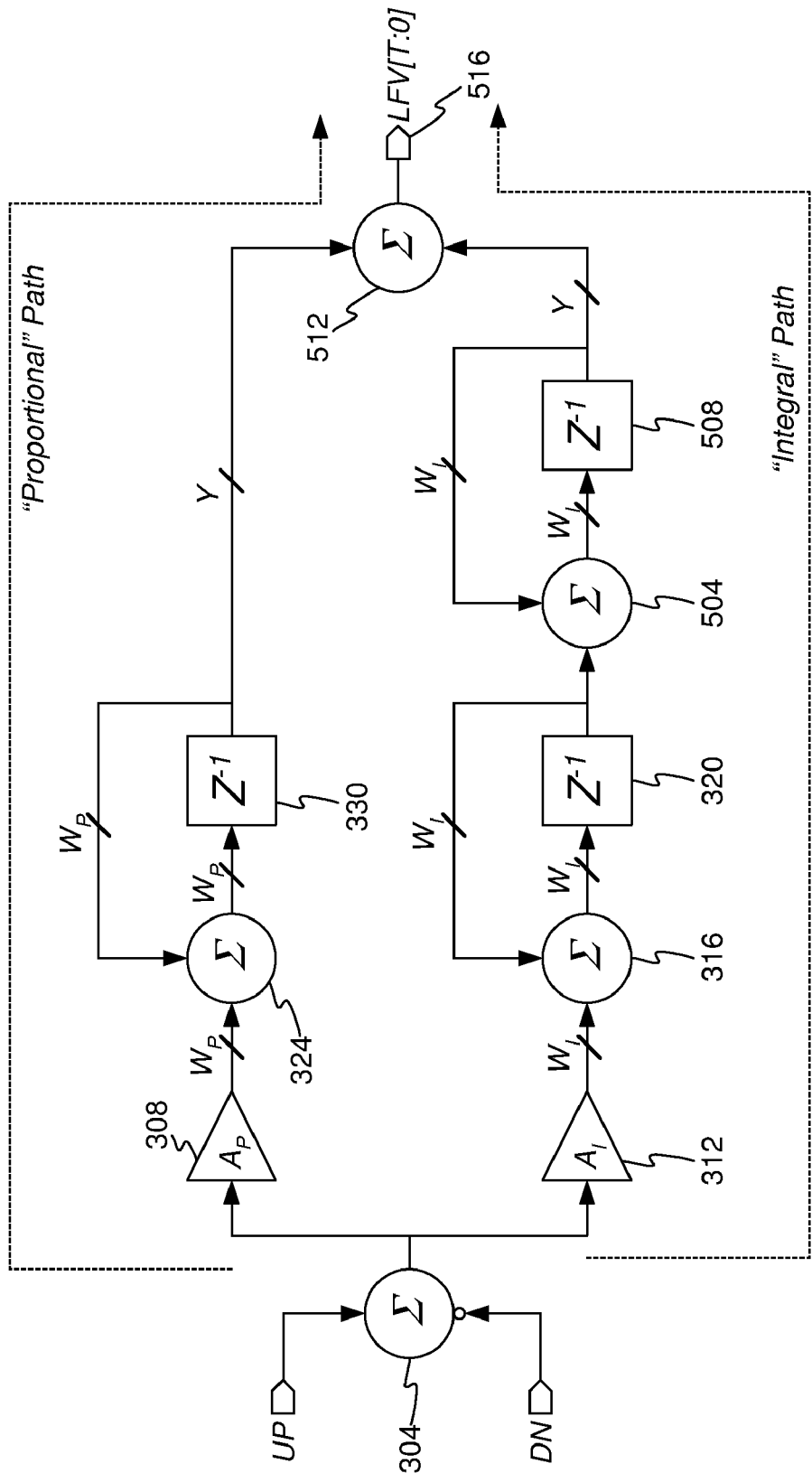
FIG. 5 is an alternative embodiment of a loop filter implementation shown in FIG. 3.

FIG. 5 is an alternative embodiment of a loop filter implementation shown in FIG. 3. Certain elements of FIG. 5 are generally similar to the elements and configuration of FIG. 3 and as such, only the aspects of FIG. 5 which differ from FIG. 3 as discussed in detail below.

As shown in FIG. 5, the output of the delay 320 feeds into a summing junction 504. The output of the summing junction 504 connects to a delay 508. The summing junction 504 also receives a feedback signal from the delay 508. The summing junction 504 and delay, including the feedback arrangement functions as an integrator.

The output of the delay 508 comprises an Y bit wide path that feeds into a summing junction 512. The summing junction 512 also receives the output from the delay 330. The output of the summing junction 512 combines these two inputs to create the output LFV 516.

This alternate form of the loop filter utilizes 3 integrators. The upper 'proportional' path comprises a single integrator operation while the 'integral' path comprises a double integral operation. These names arise from the relationship to the PLL, where the VCO performs an integration operation. In this embodiment if Wp and Wi are the same, then the second integral path accumulator and the proportional path accumulator can be combined into one, such as is shown in FIG. 3.

The method and apparatus disclosed herein has numerous benefits and advantages over the prior art. One such advantage is that this architecture can work over a wide frequency band, since the CMU (clock multiplier unit) can have a high bandwidth, which allows for a wider tuning-range for the VCXO. As is understood, VCXO's have very low tuning range (usually in the less than 100's of PPM).

In prior art without a VCXO, a low-noise oscillator is required in order to meet jitter and PLL bandwidth requirements. It is very difficult to make an oscillator with both large tuning range and low noise. The invention disclosed herein does away with the tradeoff between PLL bandwidth and output jitter. For example, one way to get a low phase noise VCO is to severely limit the tuning range. Usual prior art values are around a few hundred MHz tuning range for a center frequency of 5 GHz, or only 5% total tuning range. Thus, the drawback to this prior art solution is that it is very difficult to make a low bandwidth VCO having a high tuning range. Therefore, the solution disclosed herein is better than a low bandwidth VCO solution.

In addition, as compared to a VCXO solution, the architecture disclosed herein is configurable for a much lower cost. Crystal oscillators usually cost about 1/10 as much as a VCXO. This provides a significant cost savings. Likewise, with the solution disclosed herein the external components are minimized. Only the crystal oscillator is external to the integrated circuit. A low phase noise CMU could be integrated, but to get a low loop bandwidth, an external loop filter capacitor is usually required.

This solution is also duplicative in operation in that the first loop can drive multiple instances of the second loop, allowing one IC to provide jitter cleaning for a multitude of plesiochronous input clocks. Either of the other prior art approaches requires a second instantiation of the entire solution. Thus, this innovation is scalable.

In the case where multiple jitter cleaners are on one integrated circuit, there is only one VCO, so there is no possibility of inductive coupling between VCO's, as there is in a low phase noise VCO solution.

In addition, the digital loop filter disclosed herein can be implemented in a manner that consumes in very little physical space while the prior art analog approaches usually require large loop filter components to be integrated onto the integrated circuit.

Another benefit is that the digital loop filter allows specialized control. For example, the loop filter can adapt to have a wide bandwidth when locking, but then narrow the bandwidth once in lock. This allows for fast lock times with low bandwidths (usually lock time is inversely proportional to bandwidth).

Moreover, in this innovation the output jitter is independent of the loop bandwidth. In these embodiments the output jitter is determined by CMU jitter, the number of phases in the phase interpolator (quantization error), and dithering in digital loop filter. With a large number of phases and a low bandwidth, the CMU jitter can be the dominant source of jitter in the system. But, when the loop parameters change, the jitter will remain constant. With any PLL solution, changing the loop bandwidth will change the output jitter, with a lower bandwidth usually producing more output jitter. In this solution the jitter is not loop bandwidth dependent.

While various embodiments of the invention have been described, it will be apparent to those of ordinary skill in the art that many more embodiments and implementations are possible that are within the scope of this invention. In addition, the various features, elements, and embodiments described herein may be claimed or combined in any combination or arrangement.

What is claimed is:

1. A method for reducing jitter in a received clock input signal, the received input signal having a second frequency and a second phase comprising:
   receiving a high frequency clock signal based on a reference signal, the reference signal at a first frequency and a first phase, the high frequency clock signal at the first frequency and the first phase;
   receiving a clock input signal at a second frequency and at a second phase, wherein the second frequency and the second phase is different than the first frequency and the first phase;
   receiving the high frequency clock signal at a phase interpolator;
   processing the high frequency clock signal with the phase interpolator based on input from a loop filter to generate a high frequency clock output which has less jitter than the high frequency clock signal;
   receiving the clock input signal and a divided version of the high frequency clock output at a phase detector;
   processing the clock input signal and the divided version of the high frequency clock output with the phase detector to generate one or more loop filter input signals to a loop filter;
   receiving the one or more loop filter input signals at a loop filter; and
   processing the one or more loop filter input signals with the a loop filter to generate the input to the phase interpolator, wherein the processing by the phase interpolator, the phase detector, and the loop filter occur in the digital domain.

2. The method of claim 1, wherein a first phase lock loop generates the high frequency clock signal.

3. The method of claim 1, wherein processing the high frequency clock signal and the clock input signal comprises changing the phase of the high frequency clock signal to match the phase of the clock input signal.

4. The method of claim 1, wherein the high frequency clock signal provided to the phase interpolator is generated by an integer phase lock loop fractional-N phase lock loop, delay locked loop, or a high-Q oscillator.

5. The method of claim 1, further comprising comparing the clock input signal and a version of the phase interpolator output to create lead/lag signal which is processed to calculate the input to the phase interpolator from the loop filter.

6. The method of claim 1, wherein the input to the phase interpolator from the loop filter comprises a phase control signal.

7. A system for reproducing a clock input signal to reduce jitter from the clock input signal, the clock input signal at a first frequency, the system comprising:
   a first loop, the first loop comprising:
      a phase detector configured to compare a reference signal to a first divider output to create at least one first lead/lag signal representing the phase relation between the reference signal to the first divider output;
      a loop filter configured to processes the at least one lead/lag signal to create a control voltage;
      a voltage controlled oscillator configured to generate a VCO output signal responsive to the control voltage;
      a divider configured to change the frequency of the VCO output signal to create the first divider output; and
   a second loop, the second loop being digital and comprising:
      a loop filter configured to process at least one second lead/lag signal to generate a phase control signal;
      a phase interpolator configured to receive the phase control signal and adjust the phase of the VCO output signal from the voltage controlled oscillator based on the phase control signal to create a phase interpolator output matching the clock input signal but with less jitter than the clock input signal;
      a divider configured to change the frequency of the phase interpolator output to create a second divider output; and
      a phase detector configured to compare the clock input signal to the second divider output to create the at least one second lead/lag signal.

8. The system of claim 7, wherein the first loop further comprises a signal generator configured to generate the reference signal.

9. The method of claim 8, wherein the signal generator comprise a crystal oscillator.

10. The system of claim 7, wherein the phase control signal comprises a digital signal representing a phase shift to be applied to the VCO output signal.

11. The system of claim 7, wherein the VCO output signal has a frequency matching a frequency of the clock input signal and phase interpolator shifts a phase of the VCO output signal match a phase of the clock input signal according to the phase control signal.

12. A system for reproducing a clock input signal to reduce jitter from the clock input signal, the clock input signal at a first frequency, the system comprising:
   a first loop, the first loop comprising:
      a phase detector configured to compare a reference signal to a first divider output to create at least one first lead/lag signal representing the phase relation between the reference signal to the first divider output;
      a loop filter configured to processes the at least one lead/lag signal to create a control voltage;
      a voltage controlled oscillator configured to generate a VCO output signal responsive to the control voltage;
      a divider configured to change the frequency of the VCO output signal to create the first divider output; and
   a second loop, the second loop comprising:
      a loop filter configured to process at least one second lead/lag signal to generate a phase control signal which comprises a digital signal representing a phase shift to be applied to the VCO output signal;
      a phase interpolator configured to receive the phase control signal and adjust the phase of the VCO output signal from the voltage controlled oscillator based on the phase control signal to create a phase interpolator output matching the clock input signal but with less jitter than the clock input signal;
      a divider configured to change the frequency of the phase interpolator output to create a second divider output; and
      a phase detector configured to compare the clock input signal to the second divider output to create the at least one second lead/lag signal.

13. The system of claim 12, wherein the first loop further comprises a signal generator configured to generate the reference signal.

14. The method of claim 13, wherein the signal generator comprise a crystal oscillator.

15. The system of claim 12, wherein the VCO output signal has a frequency matching a frequency of the clock input signal and phase interpolator shifts a phase of the VCO output signal match a phase of the clock input signal according to the phase control signal.

* * * * *